United States Patent [19]
Schmitt

[11] Patent Number: 4,891,523
[45] Date of Patent: Jan. 2, 1990

[54] CIRCUIT FOR IMAGE DISPLACEMENT IN A PARTICLE BEAM APPARATUS INDEPENDENTLY OF MAGNIFICATION

[75] Inventor: Reinhold Schmitt, Munich, Fed. Rep. of Germany

[73] Assignee: Siemens Aktiengesellschaft, Berlin and Munich, Fed. Rep. of Germany

[21] Appl. No.: 260,581

[22] Filed: Oct. 21, 1988

[30] Foreign Application Priority Data

Nov. 3, 1987 [DE] Fed. Rep. of Germany ..... 37372874

[51] Int. Cl.$^4$ ............................................. H01J 37/28
[52] U.S. Cl. .................................. 250/396 R; 250/310; 250/396 ML; 250/492.2
[58] Field of Search ................... 250/310, 311, 396 R, 250/396 ML, 492.2

[56] References Cited

U.S. PATENT DOCUMENTS

| | | | |
|---|---|---|---|
| 3,757,120 | 9/1973 | Müller et al. | 250/396 R |
| 4,063,091 | 12/1977 | Gee | 250/310 |
| 4,125,772 | 11/1978 | Holmes | 250/310 |
| 4,439,681 | 3/1984 | Norioka et al. | 250/310 |
| 4,607,333 | 8/1986 | Yasutake et al. | 250/492.2 |

FOREIGN PATENT DOCUMENTS

| | | | |
|---|---|---|---|
| 58-34552 | 3/1983 | Japan | 250/396 R |
| 59-86142 | 5/1984 | Japan | 250/396 R |
| 59-165358 | 9/1984 | Japan . | |
| 59-214149 | 12/1984 | Japan . | |
| 1441824 | 7/1976 | United Kingdom | 250/310 |

OTHER PUBLICATIONS

Publication by Springer Series in Optical Sciences, vol. 45, pp. 36-40.

*Primary Examiner*—Carolyn E. Fields
*Assistant Examiner*—John A. Miller
*Attorney, Agent, or Firm*—Hill, Van Santen, Steadman & Simpson

[57] ABSTRACT

A circuit includes an inversely fedback operational amplifier having a saw tooth deflection signal applied at its input, as well as a coil pair and an output for deflecting the particle beam of a scanning microscope within a scanned field as established by the coil current. A plurality of resistor elements are selected by a switch and a constant current source for feeding a direct current is provided to effect the image displacement at a connection P between the coil pair and respective one of the resistor elements. Since the direct current flows only through the coils but not through the resistor elements as a consequence of the feedback amplifier, image displacement is independent of magnification established by the respective resistor element.

5 Claims, 1 Drawing Sheet

CIRCUIT FOR IMAGE DISPLACEMENT IN A PARTICLE BEAM APPARATUS INDEPENDENTLY OF MAGNIFICATION

BACKGROUND OF THE INVENTION

1. Field of the Invention

The present invention is related generally to a circuit for image displacement in a particle beam apparatus independently of magnification and more particularly to such a circuit including a negative feedback current amplifier at its input side which is charged with a time dependent signal for deflecting a particle beam and whose output signal is applied to an input of a deflection unit of the particle beam apparatus.

2. Description of the Related Art

For magnified imaging of a specimen in a scanning electron microscope, the surface is scanned line-by-line with an electron beam. This triggers secondary electrons on the specimen, the number of secondary electrons being dependent upon, among other things, the material composition and the surface structure at the point of incidence of the specimen. The strength of the secondary electron current emanating from the specimen and modulated by the material contrast and topography contrast is measured in a detector whose output signal controls the intensity of a sweep beam of a monitor which is deflected synchronously with the electron beam.

In a scanning electron microscope, the magnification factor V is defined by the relationship $$V = \frac{\text{Line length on the monitor picture screen}}{\text{Line length on the specimen surface.}} \quad (1)$$

The magnification is adjustable by the current flowing in the deflection coils and covers several orders of magnitude. To select the deflection current and, thus, the magnification in the desired range, negative feedback current amplifiers are usually used. Such negative feedback amplifiers generally derive their signals from precise resistors which are switchable in a plurality of steps. For electrical image displacement, in other words to displace the scan field on the specimen surface, a variable constant field is superimposed on the field of the deflection coils. The simplest solution generates the desired constant or continuous field by adding a dc voltage to the input of the current amplifier. This has the disadvantage that the image displacement is dependent upon the magnification V which is set.

In known arrangements, one is therefore forced to modify the dc voltage or its feed or supply every time there is a switch of the precision resistors. This becomes technologically involved and cannot always be exactly implemented, resulting in discontinuous image displacements when switching magnification.

Generally, the circuit shown schematically in FIG. 1 for image displacement in a scanning electron microscope independently of magnification includes a negative feedback current amplifier OV, a coil pair SC for deflection of an electron beam PE on a specimen PR, a plurality of precision resistors $R_M$ selectable by a switch $S_l$ for setting the size of a scan field RF on the specimen surface, and a voltage source $U_V$ whose dc voltage is superimposed by one of a plurality of resistors $R_V$ on a saw-tooth deflection signal $U_S$ at an inverting input of the operational amplifier OV. Since the magnetic field established in the beam path of the primary electrons PE with the assistance of the deflection unit determines the deflection of the electron PE on the specimen surface, the size of the scan field RF in the direction of the arrow is determined by the current flow in the coils SC. The relationship $$i = \{R_r/(R_e \cdot R_M)\}U_S + \{R_r/(R_V \cdot R_M)\}U_V = i_S + i_B, \quad (2)$$

is valid for the intensity of the current i, where $i_S$ defines the size of the scan field RF in the direction established by the coil field and $i_B$ defines the image displacement in a deflection direction which is adjustable by the voltage source $U_V$. In otherwords, the image displacement refers to the position of the scan field $R_F$ on the specimen PR.

As equation (2) shows, the direct current $i_B$ which effects the image displacement is also dependent on which one of the precision resistors $R_M$ is selected by the switch $S_1$. To guarantee an image displacement independently of the magnification V, and therefore independently of the respective precision resistor $R_M$, one is forced to switch the resistor $R_V$ using a switch S2 which is coupled to the switch S1 since a change in magnification is provided by the product ($R_V \cdot R_M$) and, thus, the direct current $i_B$ retains the established value.

SUMMARY OF THE INVENTION

An object of the present invention is to provide an image displacement circuit which is independent of selected magnification. This object is achieved by a circuit in which a constant current source whose current is fed into the connection between the output of a deflection unit and the input of a circuit for variation of the amplification is provided.

An advantage obtainable with the invention is that discontinuous image displacements are avoided when switching magnification. Preferred developments and advantages of the present circuit include the use of an operational amplifier as a current amplifier and the use of plurality of resistor elements selectable by a switch as the circuit for varying amplification. A voltage source and a voltage current transformer may be provided as the deflection unit in a preferred embodiment.

Thus, the circuit of the invention includes a negative feedback amplifier whose input is a saw tooth deflection signal. A coil pair for deflecting the particle beam of a scanning microscope within a scanned field is established by the coil current, and a plurality of resistor elements are selectable by a switch. A constant current source which feeds the direct current effecting the image displacement into the connection between the coil pair and the resistor element is also included since the direct current can only flow through the coils but not through the resistor element as a consequence of the feedback of the amplifier, the image displacement is independent of the magnification established by the respective resistor element.

DESCRIPTION OF THE PREFERRED EMBODIMENTS

Figure 1:
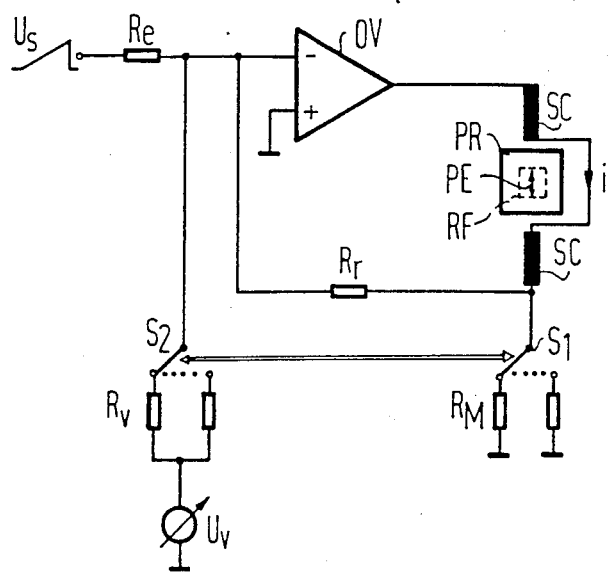
FIG. 1 shows a known circuit for image displacement in a scanning electron microscope.
Figure 2:
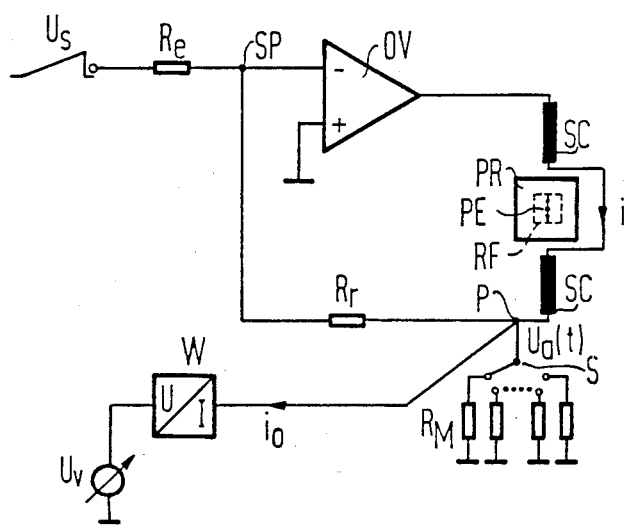
FIG. 2 shows a circuit according to the principles of the present invention for image displacement in a scanning electron microscope independently of magnification.

In the embodiment of FIG. 2 is shown schematically a circuit of the invention for image displacement in a scanning electron microscope which occurs independently of magnification. The circuit has a negative feedback operational amplifier OV. A saw-toothed deflection signal $U_S$ is applied to the inverting input of the operational amplifier OV and a coil pair SC which is known, for example, from the textbook by L. Reimer, Scanning Electron Microscopy, Springer Series in Optical Sciences, Vol. 45, pages 36-40 and particularly on page 38, in FIG. 2.18 is connected at the output. The coil pair SC deflects an electron beam PE within a scanning field RF as established on the surface of a specimen PR by the coil current. A plurality of precision resistors $R_M$ selected by a mechanical or an electrical switch S and a controllable constant current source formed by a voltage source $U_V$ and a voltage-current transformer W is also provided. This constant current source feeds a direct current $i_o$ which effects the image displacement, the direct current $i_o$ being fed between the connection of the coils SC and the respective precision resistor $R_M$ at a point P. A current then flows through the coils SC whose intensity is established by the equation $$(i = \{R_r/(R_e \cdot R_M)\} U_S + i_o := i_S + i_o \qquad (3)$$

where $i_S$ again defines the size of the scan field RF and $i_o$ defines the position thereof on the specimen surface.

The addition of the direct current $i_o$ and of the chronologically variable current $i_S$ is possible since a voltage $U_A = (R_r/R_e) U_S(T)$ at the point P does not contain a dc voltage component as a consequence of the feedback of the amplifier OV. A summing point SP for the operational amplifier OV lies at virtual ground despite a time-dependent input signal $U_S(T)$. This means that the current $i_o$ cannot flow into the output of the operational amplifier OV through the resistors $R_M$ and $R_r$ but only through the coils SC. This event is independent of the precision resistors $R_M$ which are selected by the switch S and is thus independent of the selected magnification V.

In an exemplary embodiment of the circuit of FIG. 2, the resistors are of the following values:

$R_e = 1 \text{ M} \Delta$ $R_r = 100 \text{ k} \Delta$ $R_M = 1 \text{ through } 100 \text{ k} \Delta$ In he circuit of FIG. 2, the scan field can be displaced only in the direction indicated by the double ended arrow. To displace the scan field in an arbitrary direction, a second circuit formed substantially identical to the circuit just set forth and having a coil pair arranged at 90° relative to the coil pair SC is necessary.

Of course, the invention is not limited to the exemplary embodiment set forth above. Thus, the inversely fedback operational amplifier OV can be replaced by some other current amplifier. Moreover, electronic resistor elements such as, for example, MOSFETs can be used in place of the precision resistors $R_M$.

In addition to being utilized in scanning electron microscopes, a circuit of the invention also finds utility in electron beam measuring equipment and in scanning ion microscopes.

Thus, there is disclosed circuit for image displacement in a particle beam apparatus independently of magnification.

Although other modifications and changes may be suggested by those skilled in the art, it is the intention of the inventor to embody within the patent warrented hereon all changes and modifications as reasonably and properly come within the scope of his contribution to the art.

I claim:

1. A circuit for image displacement independently of magnification in a particle beam apparatus, comprising:
   a negative feedback current amplifier having an input connected to receive a time dependent signal for deflecting a particle beam;
   a deflection unit having an input connected to receive an output signal of said negative feedback current amplifier, said deflection unit for deflecting said particle beam of said particle beam apparatus;
   a circuit for changing the amplification of said current amplifier, said circuit having an input connected to an output of said deflection unit; and
   a constant current source having an output connected to feed an output current to a connection between said output of said deflection unit and said input of said circuit for changing amplification.

2. A circuit as claimed in claim 1, wherein said negative feedback current amplifier is an operational amplifier.

3. A circuit as claimed in claim 1, wherein said circuit for changing amplification includes a plurality of resistor elements and a switch for selecting among said plurality of resistor elements.

4. A circuit as claimed in claim 1, wherein said constant current source is a voltage source and a voltage-current transformer.

5. A circuit as claimed in claim 1, wherein said deflection unit is a coil pair.

* * * * *